(12) United States Patent
Ochiai

(10) Patent No.: US 6,474,997 B1
(45) Date of Patent: Nov. 5, 2002

(54) CONTACT SHEET

(75) Inventor: Toshimasa Ochiai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/730,229

(22) Filed: Dec. 5, 2000

Related U.S. Application Data

(63) Continuation-in-part of application No. 07/410,377, filed on Sep. 30, 1999, now Pat. No. 6,293,808.

(51) Int. Cl.[7] ............................................... H01R 12/00
(52) U.S. Cl. ............................................ 439/70; 439/66
(58) Field of Search ................................ 439/70, 71, 66

(56) References Cited

U.S. PATENT DOCUMENTS

| | | | |
|---|---|---|---|
| 3,862,790 A | 1/1975 | Davies et al. ................... 439/66 |
| 4,295,700 A | 10/1981 | Sado ............................. 439/91 |
| 5,173,055 A | 12/1992 | Grabbe ......................... 439/66 |
| 5,228,861 A | 7/1993 | Grabbe ......................... 439/66 |
| 5,297,967 A | * 3/1994 | Baumberger et al. .......... 439/66 |
| 5,462,440 A | 10/1995 | Rothenberger ................ 439/66 |
| 5,578,870 A | 11/1996 | Farnsworth et al. ......... 257/727 |
| 5,629,837 A | 5/1997 | Barabi et al. ................ 361/767 |
| 5,632,631 A | 5/1997 | Fjelstad et al. ............... 439/66 |
| 5,637,088 A | 6/1997 | Kozel .......................... 439/342 |
| 5,691,041 A | 11/1997 | Frankeny et al. ............ 428/209 |
| 5,702,255 A | 12/1997 | Murphy et al. ................ 439/71 |
| 5,730,606 A | 3/1998 | Sinclair ......................... 439/70 |
| 5,812,378 A | 9/1998 | Fjelstad et al. .............. 361/769 |
| 6,045,367 A | 4/2000 | Maldonado ................... 439/66 |
| 6,328,573 B1 | * 12/2001 | Sakata et al. .................. 439/66 |

FOREIGN PATENT DOCUMENTS

| | | |
|---|---|---|
| JP | A-6-82521 | 3/1994 |
| JP | A-9-21847 | 1/1997 |
| JP | A-9-55273 | 2/1997 |
| JP | A-10-32070 | 2/1998 |
| JP | A-10-144440 | 5/1998 |

* cited by examiner

*Primary Examiner*—Tulsidas Patel
(74) *Attorney, Agent, or Firm*—Burr & Brown

(57) ABSTRACT

A contact sheet used with a socket for connecting an integrated circuit having spherical terminals to a board includes protruding contact springs in some or all of numerous through holes provided in an insulative elastic sheet, wherein each of the contact springs is composed of a conductive material and constituted by two or more cantilevers fixed onto the sheet by bonding at one end thereof. Each cantilever has a lower supporting portion composed of or a planar portion formed adjacently to a portion fixed to the sheet, and a spherical terminal holding portion formed by vertically or aslant bending the other end of the cantilever toward one of two openings of a through hole.

20 Claims, 14 Drawing Sheets

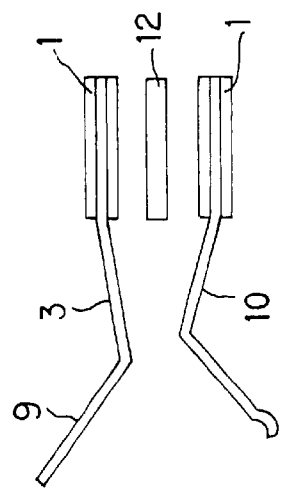
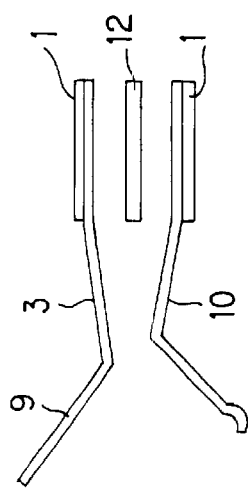
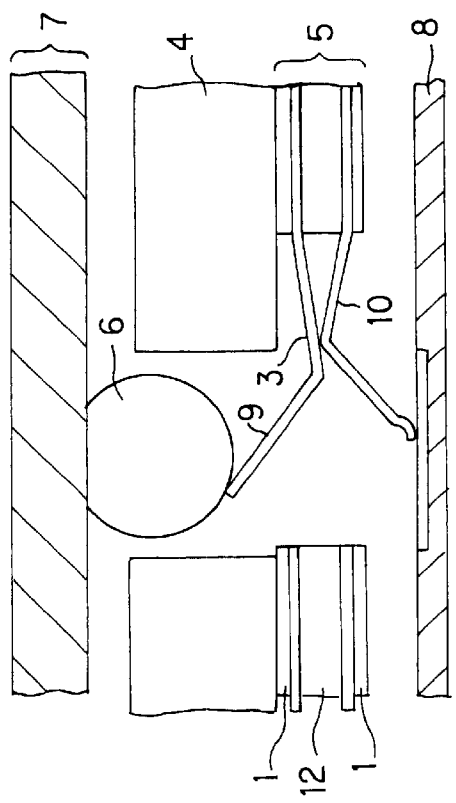
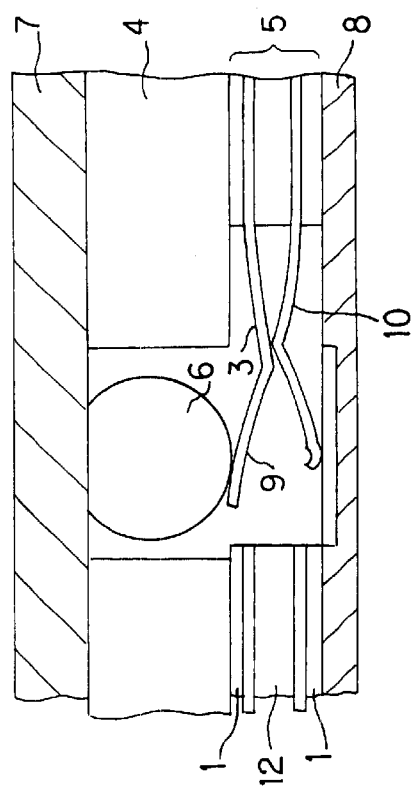

CONTACT SHEET

CROSS REFERENCE OF THE RELATED APPLICATION

The present application is a continuation-in-part application of U.S. patent application No. 07/410,377 filed on Sep. 30, 1999, now U.S. Pat. No. 6,293,808.

BACKGROUND OF THE INVENTION

The present invention relates to a contact sheet used with a socket employed for connecting an integrated circuit having spherical terminals arranged in a grid pattern, and a board, and used especially with a thin socket employed for high-frequency testing or mounting.

In recent years, because of the demands for reduced sizes and higher speed in information processing equipment, the pitches in integrated circuits are increasingly becoming smaller, and the mounting method is shifting from through-hole to surface mounting, and the arrays of terminals are shifting from peripheral arrays to grid arrays. As a result, ball grid array (BGA) devices are becoming the mainstream of packages as they permit surface mounting even for grid arrays.

A socket is used between a BGA type integrated circuit device and a board when conducting a burn-in test or a high-frequency test of the integrated circuit, and the socket is also mounted on a board when replacing an integrated, circuit. In a socket, all contacts must be in secure contact with both terminals of an integrated circuit and terminals of a board in order to ensure sufficient electrical conduction.

On the other hand, in recent years, with the increasing speed of MPUs or memories, the demand for lower inductance with respect to faster clocks has been arising. To meet the demand, it is necessary to minimize the distance over which currents pass in a contact placed between a terminal of an integrated circuit and a terminal of a board.

As a thin connector or socket with a small pitch, a component called "an anisotropic conductive sheet" has conventionally been used. There have been known, for example, conductive sheets in which conductive elastomers or, metal wires are arranged in an insulative elastomer (U.S. Pat. No. 3,862,790 and U.S. Pat. No. 4,295,700) and one in which conductive particles are added (Japanese Unexamined Patent Publication No. 6-82521). FIG. 12 shows a conventional example, wherein thin metal wires 31 are embedded in a silicone rubber 30 at a high density.

Furthermore, as conductive sheets to which considerations have been given to the aspects of BGAs that their spherical terminals are soft and their surfaces are made of solder coated with oxide films, there is one with dendrites grown on contact portions (U.S. Pat. No. 5,691,041), one in which cantilevers having protrusions are fixed on a flexible board (U.S. Pat. No. 5,629,837), one in which the surfaces of terminals on a flexible board have been provided with asperities by chemical processing or the like (Japanese Unexamined Patent Publication No. 10-32070), and one in which innumerable protrusions are formed by thermal spraying or the like (Japanese Unexamined Patent Publication No. 10-144440), etc.

Furthermore, as ones with a structure for avoiding contact with ball tips while destroying oxide films on solder surfaces, there is one having Y-shaped contacts (Japanese Unexamined Patent Publication No. 9-21847), and one inserted in finger springs (U.S. Pat. Nos. 5,702,255 and 5,730,606).

As the number of terminals of an integrated circuit increases, the force required for insertion increases. There is a contact sheet having a structure in which the foregoing force is reduced to zero, and spherical terminals are pushed laterally later by using a lever or the like (U.S. Pat. Nos. 5,578,870 and 5,637,008). As this type, one employing vertically long cantilevers is the mainstream. Moreover, there is a socket described in Japanese Unexamined Patent Publication No. 9-55273 that permits replacement of contact portions while solving the problem peculiar to solder balls mentioned above.

However, in an anisotropic conductive sheet employing the elastomer as shown in FIG. 12, mostly, terminals having flat surfaces provided with gold plating are connected. If this conductive sheet is used for connection with a BGA having spherical terminals made of solder, solder surfaces will inevitably be dented, posing a problem of unstable electrical contact.

Furthermore, in those with asperities or protrusions formed on the surfaces of the terminals on the flexible boards, variations in height of terminals will cause insufficient electrical conduction in some circuits. In the Y-shaped contacts, the distance over which currents pass is relatively long, making them unsuited as contacts for high-frequency testing or mounting although reliable electrical conduction can be ensured.

The present invention has been made with a view toward solving the problems, and an object thereof is to provide a contact sheet that (1) enables reliable electrical contact to be obtained by removal of an oxide film from a solder surface, (2) is capable of accommodating variations in height or size of spherical terminals, (3) prevents collapse of a tip, (4) features a short distance over which currents pass, (5) permits a zero insertion force (ZIF) structure to be implemented as necessary, and (6) also enables a structure for permitting replacement to be implemented.

SUMMARY OF THE INVENTION

More specifically, according to the present invention, a contact sheet is provided to connect an electrical device (i.e., integrated circuit) having terminals and a board, having protruding contact springs in some or all of numerous through holes provided in a sheet composed of an insulative elastic material, wherein the contact springs are composed of a conductive material and constituted by two or more cantilevers fixed onto the sheet by bonding or clamping one end thereof, each cantilever has a lower supporting portion and a spherical terminal holding portion, the lower supporting portion is composed of a linear portion or a planar portion formed adjacently to a portion fixed to the sheet, the spherical terminal holding portion is formed by vertically bending the other end of the cantilever toward one of two openings of a through hole, the spherical terminal enters into a gap at the spherical terminal holding portion of the two or more cantilevers when the integrated circuit is mounted, and thereby the spherical terminal holding portions of the two or more cantilevers are pushed and spread in a direction away from the portion of each cantilever that is fixed to the sheet, and at the same time, a boundary portion between the spherical terminal holding portions and the lower supporting portion is pressed against the board.

Preferably, in the contact sheet set forth above, each contact spring is composed of three cantilevers, the three cantilevers are disposed virtually parallel to each other in the through hole, and two cantilevers on both ends of the three cantilevers and the middle cantilever are fixed to edges of the through hole that oppose each other because contact pressure on spherical terminals is well-balanced between a direction along the line and the direction perpendicular to the line, which makes spotting possible.

Furthermore, according to the present invention, there is provided a contact sheet used for a socket for achieving connection between an integrated circuit having spherical terminals and a board, having protruding contact springs in some or all of numerous through holes provided in a sheet composed of an insulative elastic material, wherein each of the contact springs is constituted by two or more cantilevers composed of a conductive material, the two or more cantilevers are respectively fixed to adjoining edges of the through hole at one end thereof so that each of them has two end portions and they are oriented in parallel to each other, each cantilever has a lower supporting portion and a spherical terminal holding portion, the lower supporting portion is composed of a linear portion or a planar portion formed adjacently to a portion fixed to the sheet, the spherical terminal holding portions are formed by vertically or obliquely bending the other ends of the two or more cantilevers toward one of two openings of a through hole, and when the integrated circuit is mounted, the spherical terminals push and spread the spherical terminal holding portions of the two or more cantilevers in a direction away from the portion of each cantilever that is fixed to the sheet and a boundary portion between the spherical terminal holding portions and the lower supporting portion is pressed against the board.

It is preferable that dispositions of two or more cantilevers installed in a through hole of an arbitrary one column and dispositions of the two cantilevers installed in a through hole of another column adjacent to the one column have a point symmetrical relationship because contact pressure on spherical terminals in a direction of a line is well-balanced by a pair of holes with the adjacent line, which makes spotting possible.

It is preferable in a contact sheet of the present invention that a through hole has a shape of a rectangle and a longitudinal direction of the rectangle coincides with a diagonal direction with reference to the disposition of the spherical terminals because the cantilevers can be made long, much displacement can be taken, and permanent set in fatigue as a spring is small.

Preferably, in the contact sheet in accordance with the present invention, it is preferable that each contact spring is composed of two or more cantilevers, the two or more cantilevers are disposed parallel to one another in the through hole, and a bridge connecting the lower supporting portion of the two or more cantilevers fixed to edges of the through holes adjacent to each other among the two or more cantilevers is provided because it avoids more than necessary separation of two spherical terminal holding portions when spherical terminals enters into the spherical terminal holding portions.

Further, as shown in FIG. 3(a), a cantilever of a contact sheet is preferably in contact with the board before an integrated circuit is mounted because the securer electrical conduction can be ensured.

In the present invention, it is preferable that two contact sheets are unitarily formed by means of an adhesive sheet having through holes of the same pattern as the contact sheets, and each of the contact sheets has the same number of contact springs on both sides of the adhesive sheet.

In addition, cantilevers of the contact springs provided on both side of the adhesive sheet are mutually in contact with one another with mutually applying pressure before the integrated circuit is mounted. For such an adhesive sheet, an anisotropic conductive membrane may be used.

Furthermore, in the contact sheet in accordance with the present invention, it is preferable that two sheets composed of an insulative elastic material are superposed and that one end of the cantilever is bonded by the two sheets so as to fix the cantilever to the sheet.

BRIEF DESCRIPTION OF THE DRAWINGS

FIGS. 2(a) and (b) are schematic representations showing a mode for mounting an integrated circuit on the first contact sheet in accordance with the present invention, wherein FIG. 2(a) shows a state before mounting.

FIGS. 3(a) and (b) are schematic representations showing another mode for mounting an integrated circuit on the first contact sheet in accordance with the present invention, wherein FIG. 3(a) shows a state before mounting.

FIGS. 6(a) and (b) are schematic representations showing a mode for mounting an integrated circuit on the second contact sheet in accordance with the present invention, wherein FIG. 6(a) shows a state before mounting.

FIGS. 7(a)–(c) are schematic sectional views showing an embodiment of a cantilever in the first and second contact sheets in accordance with the present invention, wherein FIG. 7(a) shows one example, FIG. 7(b) shows another example, and FIG. 7(c) shows still another example.

FIGS. 11(a) and (b) are schematic representations showing a mode wherein a contact sheet in accordance with the present invention is applied to the ZIF structure and an integrated circuit is mounted thereon, wherein FIG. 11(a) shows a State before operation and FIG. 11(b) shows a state after operation.

FIGS. 14(a)–(d) are explanatory views showing a mode wherein an integrated circuit is mounted on a contact sheet in accordance with the present invention, wherein FIG. 14(a) shows a state before mounting, FIG. 14(b) shows a state after mounting, FIG. 14(c) is a deal drawing of a contact sheet, and FIG. 14(d) is a deal drawing of a contact sheet using an anisotropic conductive membrane for an adhesive sheet.

FIGS. 15(a)–(b) show examples wherein an integrated circuit having spherical terminals thereon is mounted and a contact spring is composed of two cantilevers, wherein FIG. 15(a) shows the case of one contact sheets and FIG. 15(b) shows the case of two contact sheets. FIGS. 15(c)–(e) show examples wherein an integrated circuit having a plane terminal thereon. FIG. 15(c) shows the case of one. contact sheet wherein a contact spring is composed of two cantilevers, FIG. 15(d) shows the case of one contact sheet wherein a contact spring is composed of three cantilevers, and FIG. 15(e) shows the case of two contact sheets wherein a contact spring is composed of three cantilevers.

FIGS. 16(a) and (b) are schematic representations showing a mode wherein an integrated circuit having an LGA is mounted on a contact sheet in accordance with the present invention, wherein FIG. 16(a) shows a state before mounting.

FIGS. 17(a) and (b) are schematic representations showing a mode wherein an integrated circuit having an LGA is mounted on a contact sheet in accordance with the present invention, wherein FIG. 17(a) shows a state before mounting.

DETAILED DESCRIPTION OF THE INVENTION

Figure 1:
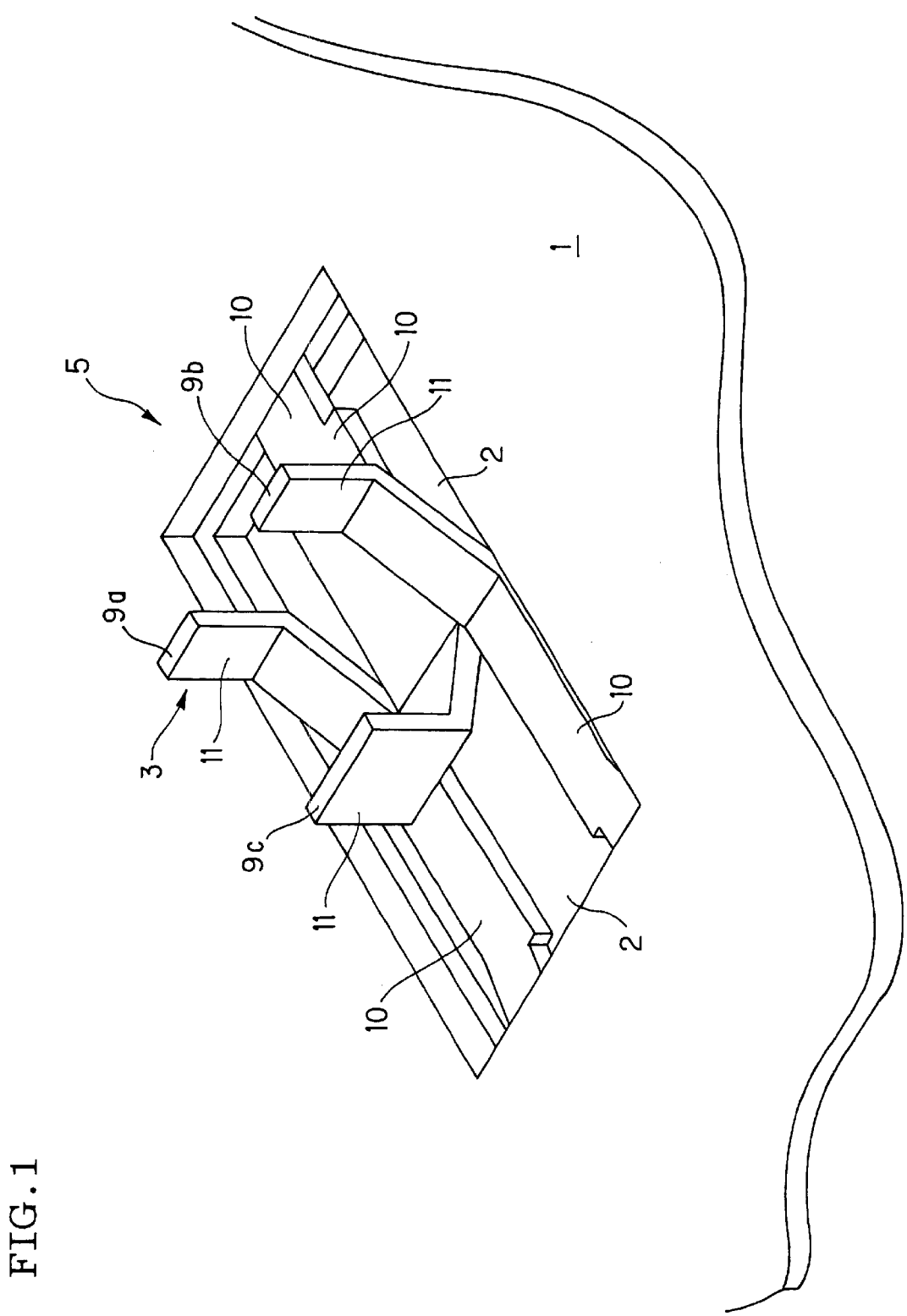
FIG. 1 is a perspective view showing an example of a first contact sheet in accordance with the present invention.

As shown in FIG. 1, a first contact sheet 5 in accordance with the present invention has protruding contact springs 3 in some or all of numerous through holes 2 provided in a sheet 1 formed of an insulative elastic material. The contact springs 3 are formed of a conductive material having two end portions and constituted by two or more facing cantilevers 9(9a, 9b, and 9c) that are fixed to the sheet 1 by bonding at one end thereof. Each of the cantilevers 9a, 9b, and 9c has a lower supporting portion 10 and a spherical terminal holding portion 11, the lower supporting portion 10 is composed of a planar portion formed adjacently to a portion fixed to the sheet 11, and the spherical terminal holding portion 11 is formed by vertically bending the other end of the cantilever 9 toward one of two openings of the through hole 2.

Figure 2A:
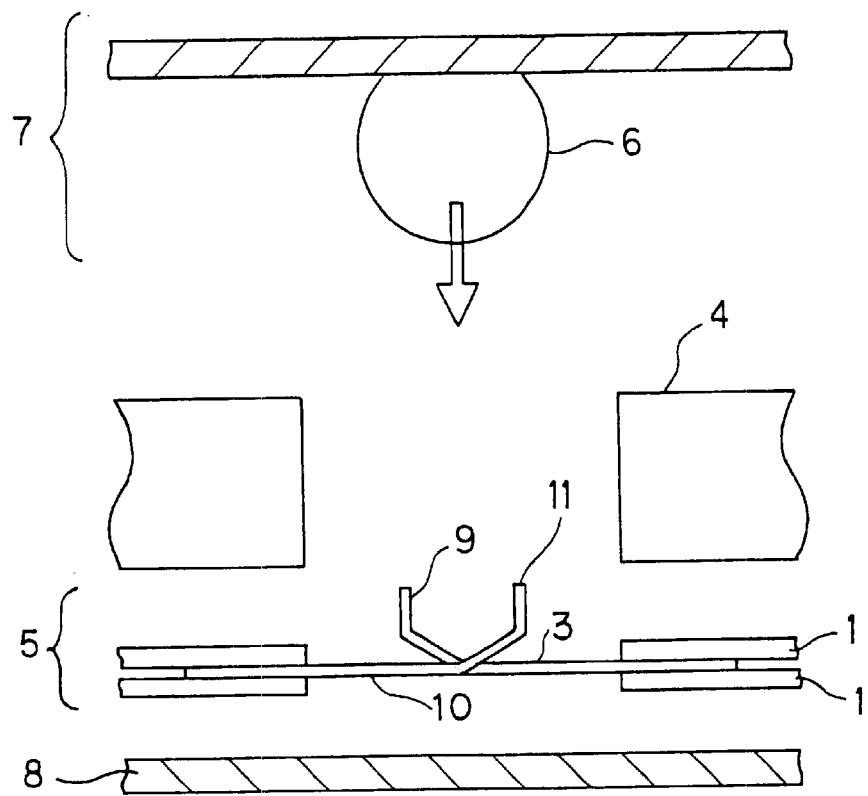
Figure 2B:
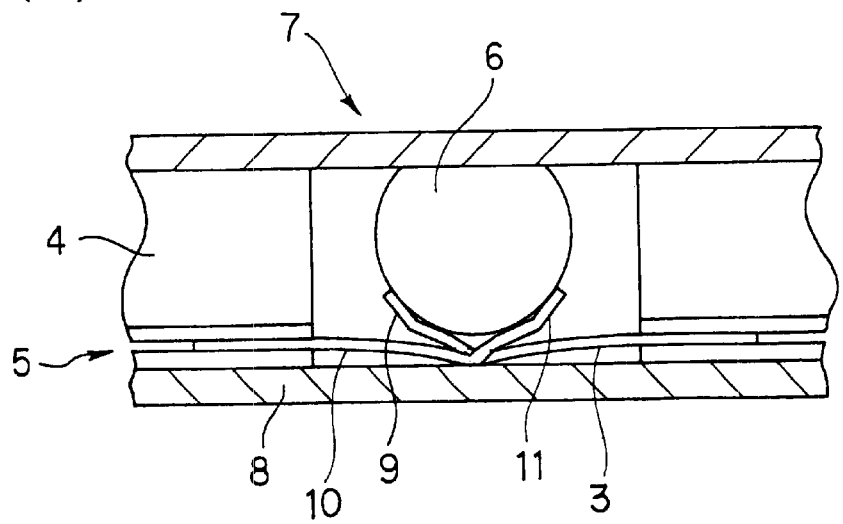
FIG. 2(b) shows a state after mounting.

When mounting an integrated circuit 7, a spherical terminal 6 of the integrated circuit 7 such as a BGA package enters in a gap between the spherical terminal holding portions 11 of two or more cantilevers 9 (9a, 9b, and 9c), causing the lower supporting portions 10 of the cantilevers 9 to flex toward the other openings, and after the lower supporting portions 10 come in contact with a board 8, the spherical terminal holding portions 11 of the two or more cantilevers 9 are pushed and spread in a direction away from the portions of the individual cantilevers 9 that are fixed to the sheet 1 as illustrated in FIG. 2(a) and FIG. 2(b). Reference numeral 4 denotes a spacer.

Figure 3A:
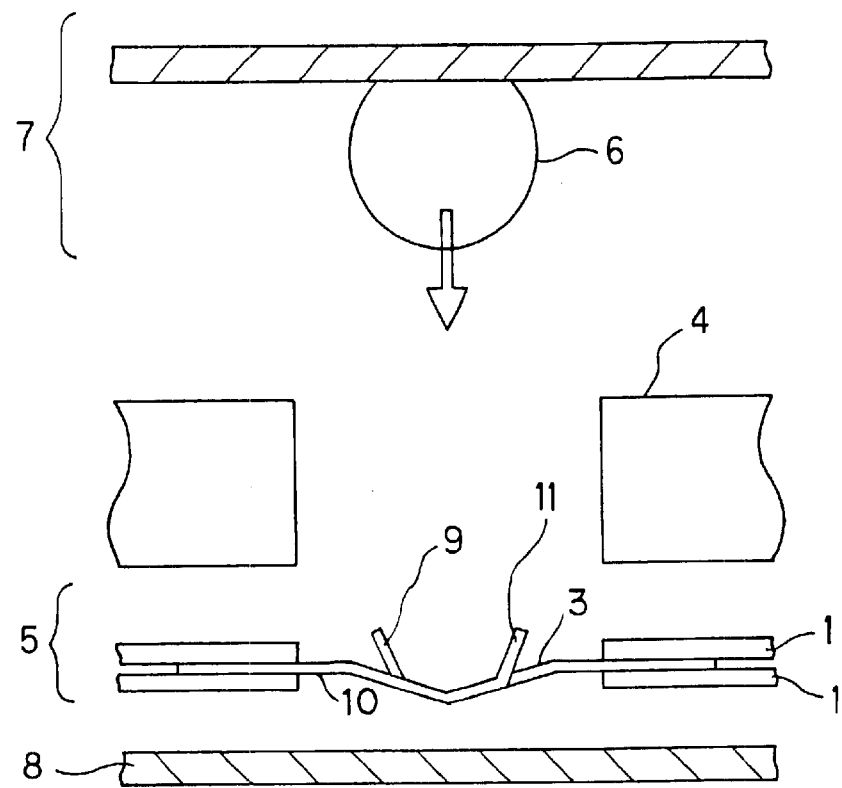
Figure 3B:
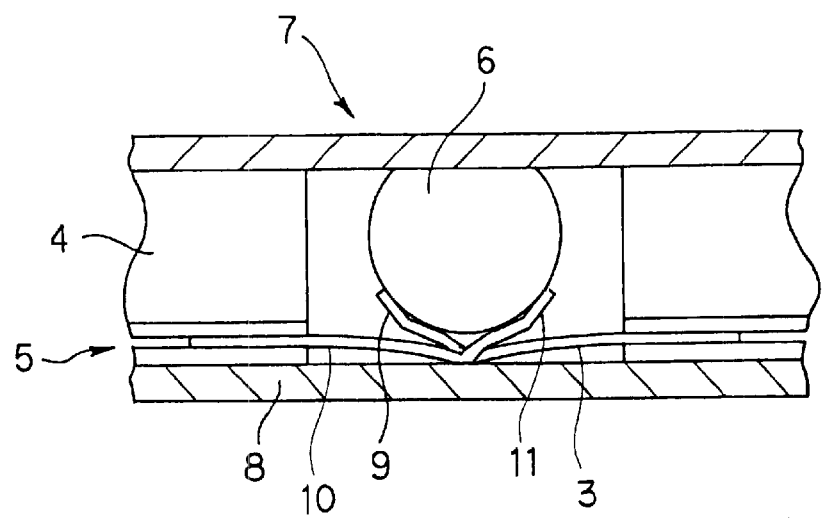
FIG. 3(b) shows a state after mounting.

When the cantilever 9 of the contact spring 3 has a shape as shown in FIG. 3(a), the moment the spherical terminal 6 of the integrated circuit 7 such as a BGA package enters the gap of the spherical terminal holding portions 11 of the cantilevers 9, the contact sheet 5 is pressed against the board 8, causing the spherical terminal holding portions 11 to be narrower, and entry of the spherical terminal 6 into the narrowed spherical terminal holding portions 11 causes the spherical terminal holding portions 11 to be pushed and spread in a direction away from the portions of the individual cantilevers 9 that are fixed to the sheet 1 as shown in FIG. 3(b). In this case, the lower supporting portions 10 is bent toward the board 8 side, and a boundary portion between the spherical terminal holding portions 11 and the lower supporting portion 10 is in contact with the board 8 in advance even if the integrated circuit 7 is not mounted. Therefore, securer electric conductivity can be obtained, and reliability is enhanced.

In the contact sheet 5 mentioned above, the respective cantilevers 9 are long since they have the lower supporting portions 10 and the spherical terminal holding portions 11, and they, as springs, do not incur permanent set in fatigue since much displacement can be secured when the spherical terminals are pressed against them. Moreover, since the spherical terminal holding portions 11 are vertically bent, they hardly spread laterally when subjected to vertical displacement of the spherical terminals. Therefore, variations in height of spherical terminals of integrated circuits or warps in integrated circuits or boards, if any, can be absorbed by the spring without permanent set in fatigue to ensure electrical conduction between an integrated circuit and a board.

Furthermore, the spherical terminal holding portions 11 of the cantilevers 9 are formed by vertically bending one end of each of the cantilevers 9 toward one of two openings of each of the through hole 2, and the spherical terminal 6 pushes and spreads the respective cantilevers 9 to enter gaps of the spherical terminal holding portions 11 of the respective cantilevers 9. Hence, the spherical terminal 6 comes in contact with the cantilever 9 at a side surface thereof and a distal end portion of the spherical terminal 6 does not come in contact with the lower supporting portion 10, eliminating chances of crushing the distal end portion of the spherical terminal 6. Moreover, at the time of mounting an integrated circuit on a board, when the spherical terminal 6 enters in a gap of the spherical terminal holding portions 11 while pushing and spreading the spherical terminal holding pOrtions 11 of the cantilevers 9, an oxide film is scraped off by edges of end portions of the cantilevers 9, thus securing reliable electrical conduction.

In addition, conduction between a terminal of the board 8 and the cantilevers 9 is accomplished when the spherical terminal 6 pushes and causes the lower supporting portions 10 of the cantilevers 9 to flex, causing a portion of the cantilevers 9 to come in contact with the terminal of the board. Hence, the distance over which currents pass in the contact springs 3 can be shortened and an inductance in relation to fast clocks can be reduced, making the contact sheet ideally used for mounting and high-frequency testing. Specifically, in the contact sheet described above, the current passing distance in the contact springs can be reduced to about a radius of the spherical terminal, or 0.15 to 0.5 mm to be more specific.

In the contact sheet 5 set forth above, the respective cantilevers 9 are disposed such that they underlie the spherical terminal 6, allowing the lower supporting portions 10 of the respective arms 9 to be made longer. Accordingly, when mounting an integrated circuit on the board via the contact sheet 5, a large displacement can be allowed within the elasticity of the contact springs, so that unnecessary load will not be applied to the board. In addition, the contact springs will not break easily.

In the contact sheet described above, each of the contact springs 3 may be composed of three cantilevers 9 (9a, 9b, and 9c), the three cantilevers 9 may disposed virtually parallel to each other in the through holes 2, and two cantilevers 9a and 9b on both ends of the three cantilevers 9 and the middle cantilever 9c may be fixed to edges of the through holes 2 that oppose each other as shown in FIG. 1. This arrangement permits easier positioning of an integrated circuit having the spherical terminals 6 also by the contact sheet 5.

Figure 4:
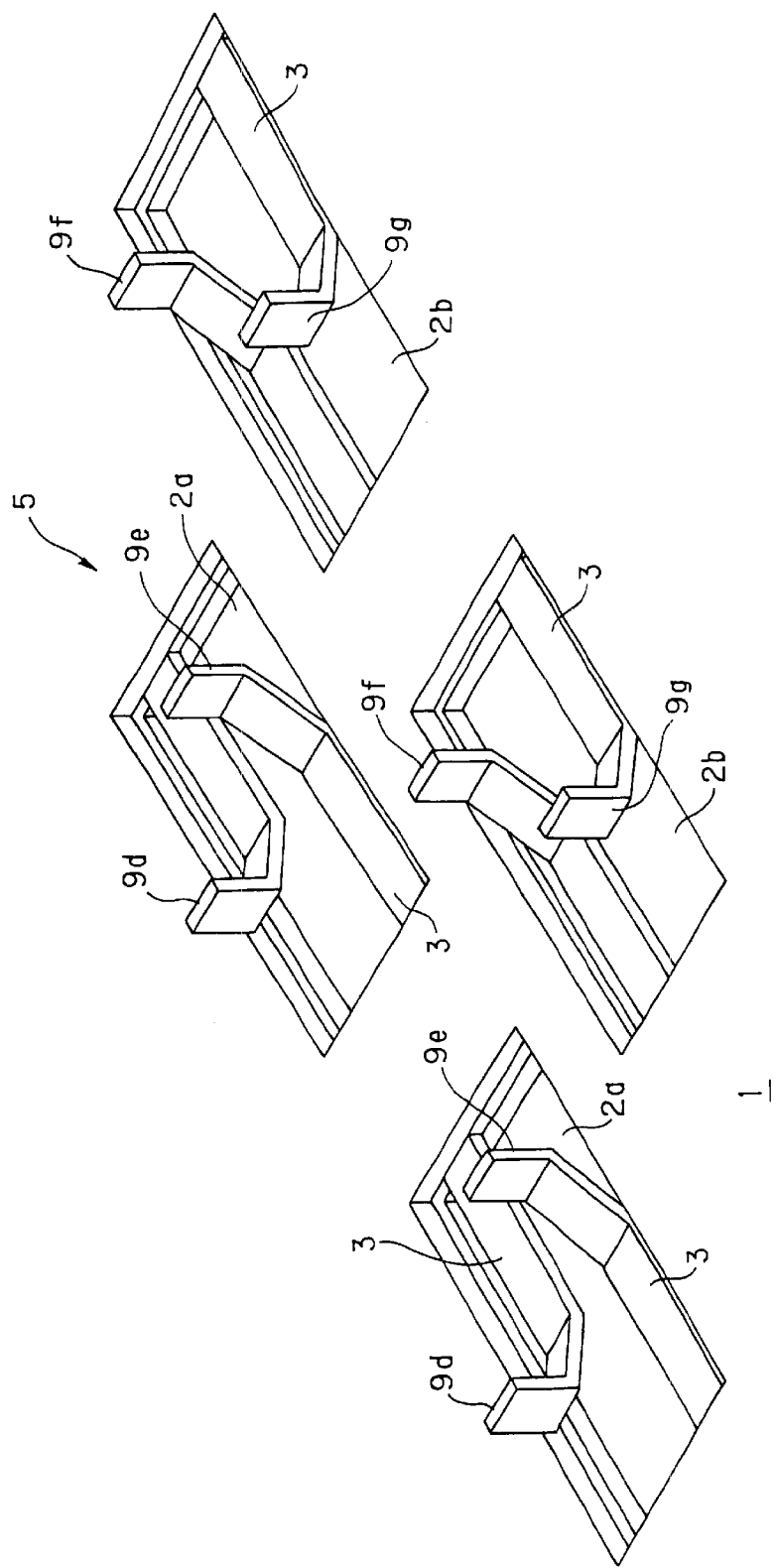
FIG. 4 is a perspective view showing an example of a second contact sheet in accordance with the present invention.

Furthermore, the contact sheet set forth above may be configured as shown in FIG. 4, wherein each contact spring 3 is formed of two cantilevers 9 (9d and 9e), the two cantilevers 9 are disposed parallel to each other in the through holes 2, the two cantilevers 9 are fixed to edges of the through holes 2 that oppose each other, and a disposition of the two cantilevers 9d and 9e installed in a through hole 2a of an arbitrary one column and a disposition of another two cantilevers 9f and 9g installed in a through hole 2b of another column adjacent to the foregoing one column are in a mirror image relationship. The mirror image relationship of the dispositions of the cantilevers in adjoining columns permits easier positioning of an integrated circuit having spherical terminals in relation to the contact sheet 5. More specifically, if the contact sheet 5 is formed of two cantilevers 9, there is no force to restrict the spherical terminal in a direction indicated by an arrow in FIG. 4, and therefore, positioning is impossible even if the spherical terminal is placed in the gap at the spherical terminal holding portions of the two cantilevers. However, the spherical terminals escape in different directions in the adjacent columns cancel each other as shown in FIG. 4 when the cantilevers 9 of adjacent columns are disposed to carry the mirror image relationship, thus making positioning easier.

Figure 5:
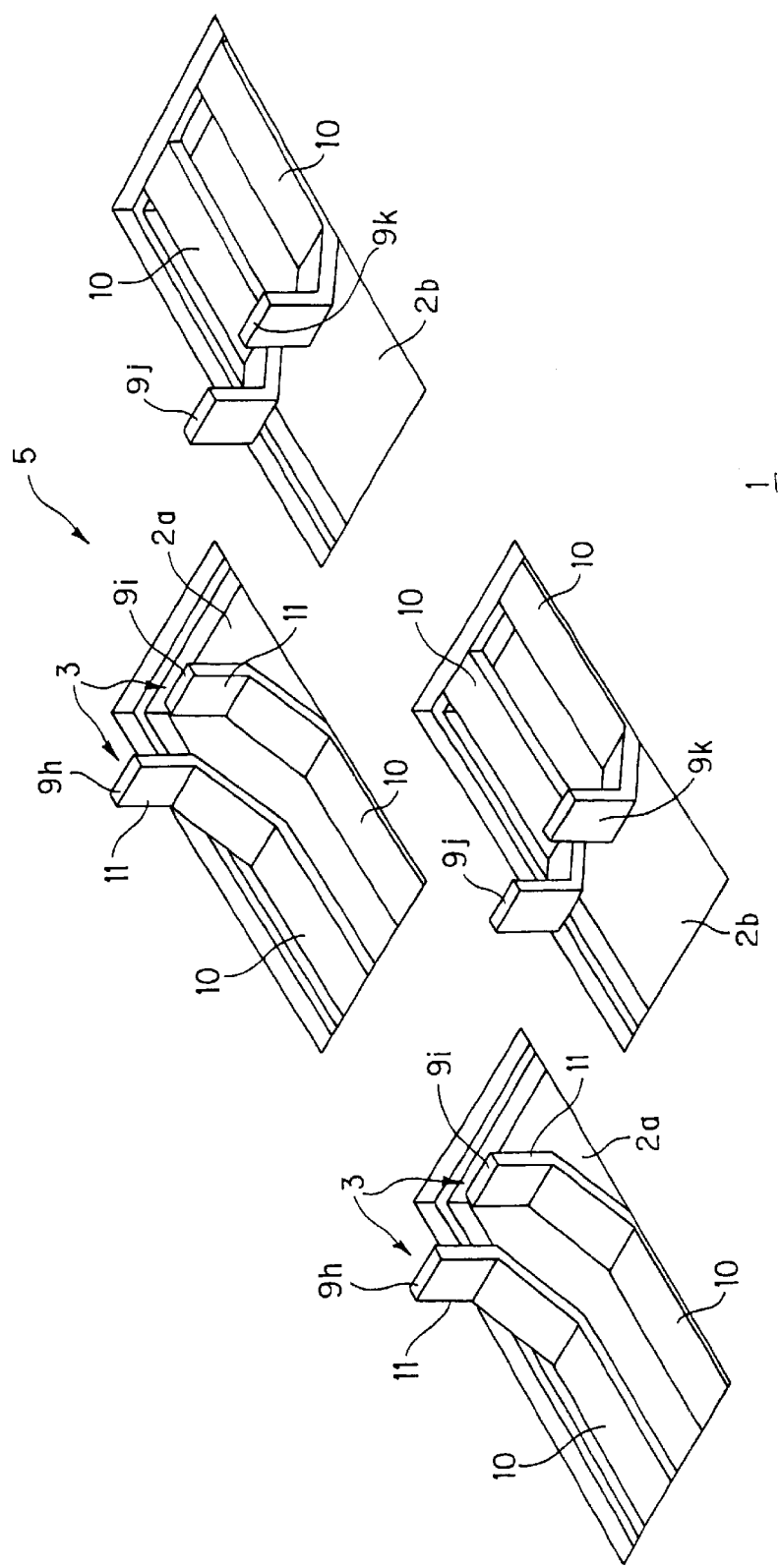
FIG. 5 is a perspective view showing another example of the second contact sheet in accordance with the present invention.

A second contact sheet in accordance with the present invention has protruding contact springs 3 in some or all of numerous through holes 2 provided in a sheet 1 formed of an insulative elastic material, and the contact springs 3 are constituted by two or more cantilevers 9 formed of a conductive material as shown in FIG. 5. The two or more cantilevers 9 are individually fixed at one end thereof on adjoining edges of the through holes 2 such that they have two end portions and are parallel to each other, each of the cantilevers 9 having a lower supporting portion 10 and a spherical terminal holding portion 11. The lower supporting portion 10 is composed of a linear portion or a planar portion formed adjacently to a portion fixed to the sheet 1, the spherical terminal holding portion 11 is formed by bending the other end of the two or more cantilevers 9 toward one of two openings of a through hole.

Figure 6A:
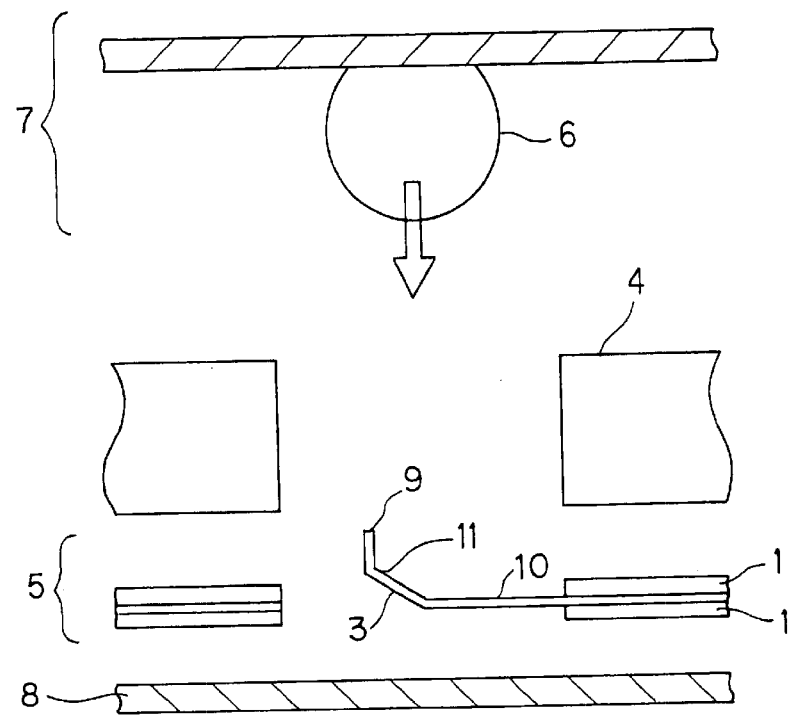
Figure 6B:
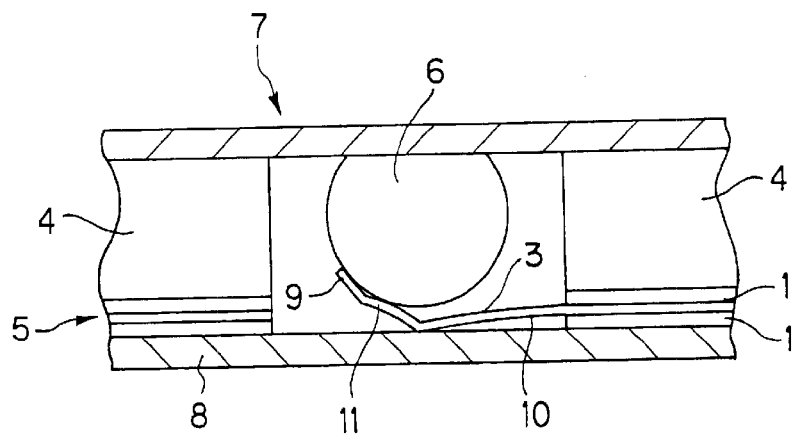
FIG. 6(b) shows a state after mounting.

When an integrated circuit 7 is mounted, a spherical terminal 6 pushes and spreads the spherical terminal holding portions 11 of the two or more cantilevers 9 in a direction away from portions of the respective cantilevers 9 that are fixed to the sheet 1 and also flexes the lower supporting portions 10 toward a surface away from the sheet 1 as illustrated in FIG. 6(a) and FIG. 6(b).

It is preferable that dispositions of two or more cantilevers 9h and 9i installed in a through hole 2a of an arbitrary one column and dispositions of two cantilevers 9j and 9k installed in a through hole 2b of another column adjacent to the foregoing one column have a point symmetrical relationship because contact pressure on the spherical terminal in a direction of a line is well-balanced by a pair of holes with the adjacent lines to fix a position of a ball by the contact.

Due to the same reason as that in the first contact sheet in accordance with the present invention, the contact sheet described above protects a distal end portion of a spherical terminal, ensures secure electrical conduction by removing an oxide film, and shortens a current passing distance in a contact spring, allowing inductance in relation to fast clocks to be reduced. In this case, it is preferable to dispose the cantilevers 9 so that they are oriented parallel to a direction of a column to which the through hole 2 where the cantilevers are installed belongs as shown in FIG. 5.

Figure 7A:
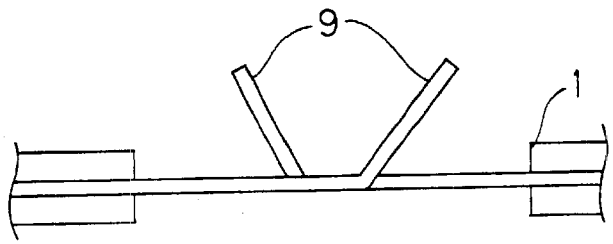
Figure 7B:
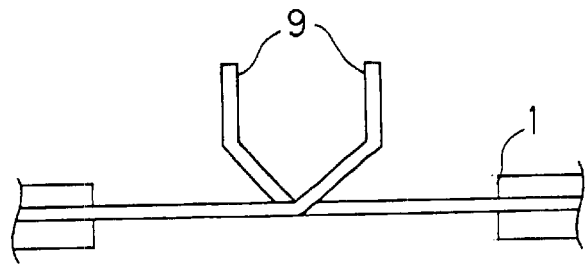
Figure 7C:
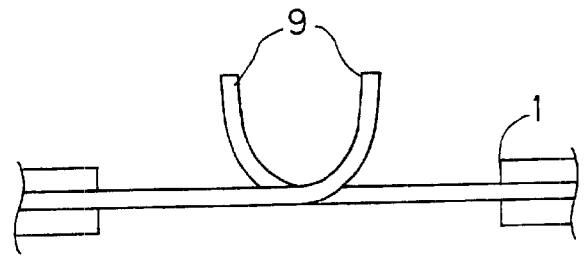

In the first and second contact sheets in accordance with the present invention, the cantilevers are bent to form the spherical terminal holding portions. There are no particular restrictions on how the cantilevers are bent as long as a spherical terminal can be set in a gap at the spherical terminal holding portions by pushing and spreading the spherical terminal holding portions, the spherical terminal holding portions are able to hold a spherical terminal at a portion other than a distal end portion of the spherical terminal, and an oxide film can be scraped off by edges of the cantilevers when the spherical terminal pushes and spreads the spherical terminal holding portions. For instance, the cantilever may be bent at one point as illustrated in FIG. 7(a), it may be bent at two points as illustrated in FIG. 7(b), or it may be continuously bent into an arc shape as illustrated in FIG. 7(c). Furthermore, the cantilevers 9 may be formed by a long and slender plate-like member or by a linear member.

Figure 8:
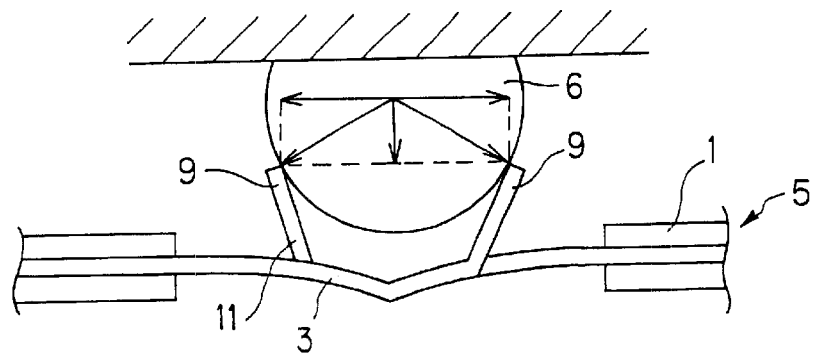
FIG. 8 is a schematic representation illustrating balance of a force in the first and second contact sheets in accordance with the present invention.

In the first and second contact sheets in accordance with the present invention, where an integrated circuit having spherical terminals has been mounted, it is desirable that a force of the spherical terminal 6 pushing the spherical terminal holding portions 11 of the cantilever 9 is greater than a force of the spherical terminal 6 pushing the contact springs 3 in a perpendicular direction in relation to the sheet 1 as shown in FIG. 8. This effectively scrapes an oxide film of the spherical terminal and minimizes a force required for mounting or removing an integrated circuit thereby to prevent an extra force from being applied to a board. More specifically, when mounting an integrated circuit having numerous terminals as an integrated circuit having a grid arrangement on a board, a force applied to the board is a total sum of forces applied by respective terminals of the integrated circuit. Hence, in order to prevent damage to the board, it is necessary to minimize forces of spherical terminals pushing contact springs against a sheet in a vertical direction. Preferably, surfaces of the spherical terminals are scraped by 0.01 to 0.05 mm to effectively remove an oxide film.

Figure 13:
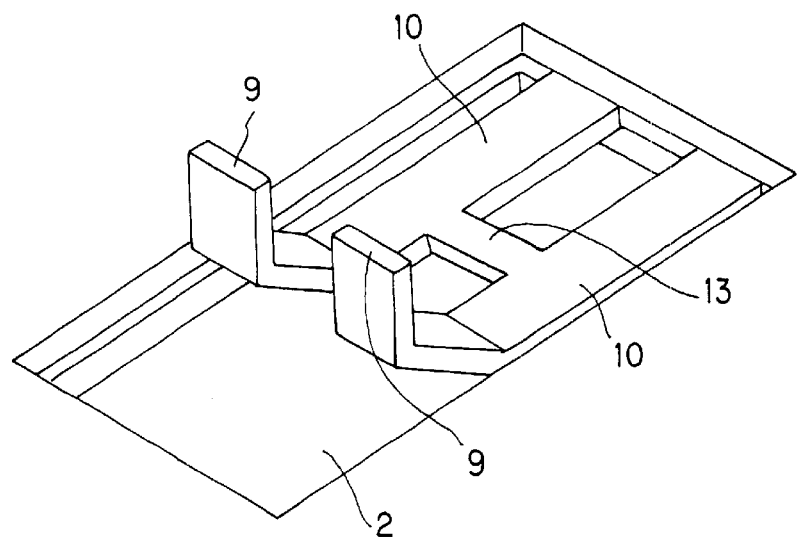
FIG. 13 is a perspective view showing an example having a bridge of the first and the second contact sheets of the present invention.

In addition, in the first and second contact sheets in accordance with the present invention, it is preferable that each contact spring is composed of two or more cantilevers, the two or more cantilevers are disposed in parallel with each other in a through hole, and there is provided a bridge 13 for mutually connecting the lower supporting portion 10 of two or more cantilevers 9 fixed to mutually adjacent edges of the through hole 2 as shown in FIG. 13 in the case that two or more cantilevers fixed to mutually adjacent edges of the through hole among the two or more cantilevers. The bridge 13 can prevent the spherical terminal holding portions 11 from being extended right and left, i.e., in a direction perpendicular to the opening portion of the through hole 2 more than necessary when a spherical terminal 6 gets into the spherical terminal holding portions 11. Incidentally, if the bridge is too far from the spherical terminal 6, the spherical terminal holding portion 11 is widely extended. If the bridge 13 is present in a portion in contact with the board 8 and the planar terminal 16, the two or more cantilevers 9 hardly move independently, and it sometimes happens that the number of contact points between the spherical terminal holding portion 11 and the spherical terminal 6, the board 8, the planar terminal 16 or the like are decreased. Therefore, it is preferable that the bridge 13 is placed in a position as near to the planar terminal 6 as possible without a portion in contact with the board 8 or the planar terminal 16.

In the first and second contact sheets in accordance with the present invention, it is also preferable that two contact sheets are unitarily formed by means of an adhesive sheet having through holes in the same pattern as the contact sheets and that each of the two contact sheets is a two-ply contact sheet having the same number of contact springs on both sides of the adhesive sheet. By using the two-ply contact sheet, the displacement can be twice as large as a contact sheet even if contact springs having the same elasticity are used. FIGS. 14(a)–(d) show an embodiment of a two-ply contact sheet. FIG. 14(a) shows a state before an integrated circuit 7 is mounted, FIG. 14(b) shows a state after the integrated circuit 7 is mounted.

Contact springs may be plane-symmetric with the adhesive sheet being centered or may have different shapes irrelevant to one another. In a two-ply contact sheet shown in FIGS. 14(a)–(d), the contact springs 3 are not plane-symmetric with the adhesive sheet 12 being centered but of different shapes irrelevant to one another. However, in a contact spring 3 on the side of the board 8, a tip of a portion corresponding to a spherical terminal holding portion is rounded so as not to damage the planar terminal on the side of the board 8.

In addition, if cantilevers of two contact springs on both side of the adhesive sheet are bent in a direction where they are brought into contact with each other before they are bonded, they contact each other by applying pressure to each other before an integrated circuit is mounted, and better electric conductivity is ensured to increase reliability.

For an adhesive sheet, an anisotropic conductive membrane as shown in FIG. 14(d) can be suitably used. An anisotropic conductive membrane is a sheet showing conductivity in a direction of thickness and insulating ability in a transverse direction and using an adhesive agent as a substrate. The membrane can bond a metal and an insulator at the same time, and besides it prevent electric current from leakage due to the characteristic, secure electric conductivity can be ensured to further improve reliability.

Figure 9:
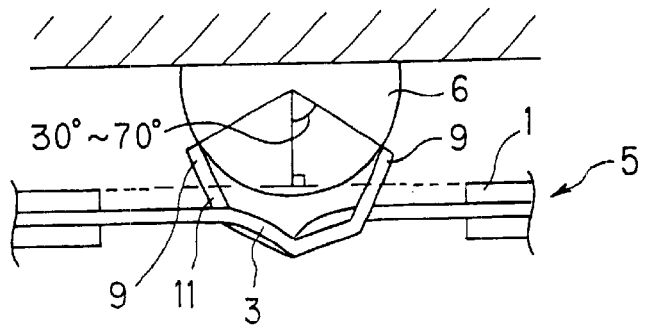
FIG. 9 is a schematic representation illustrating a contact point of a contact spring and a spherical terminal in a contact sheet in accordance with the present invention.

In the first and second contact sheets in accordance with the present invention, it is preferable that a magnitude of an angle formed by a straight line connecting a contact point of the cantilever 9 and a spherical terminal 6 and a central point of a spherical terminal 6 and a perpendicular drawn from the central point of the spherical terminal 6 to the sheet 1 ranges from 30 to 70 degrees as illustrated in FIG. 9 in a process for mounting an integrated circuit having spherical terminals and in a state wherein the integrated circuit has been mounted. If the angle is below 30 degrees, then distal end portions of the spherical terminals may be scratched, while if the angle exceeds 70 degrees, then it is difficult to effectively hold the spherical terminals.

From a viewpoint of appropriately reducing the force of the spherical terminals pushing the contact springs against the sheet in the vertically direction, it is further preferable to set the magnitude of the angle, which is formed by the straight line connecting the contact point of the cantilever and the spherical terminal with a central point of the spherical terminal and a perpendicular drawn from the central point of the spherical terminal to the sheet, to 45 to 60 degrees. The angle mentioned above can be adjusted by appropriately adjusting a diameter of the spherical terminal, a thickness of a sheet constituting the contact sheet, and an angle at which the cantilever is bent.

The contact sheet in accordance with the present invention is also suitably used with a socket having a zero insertion force (ZIF) structure. For example, a contact sheet shown in FIG. 10 has protruding contact springs 3 in some or all of numerous through holes 2 provided in a sheet 1 formed of an insulative elastic material, and each of the contact springs 3 is formed of two or more cantilevers 9 made of a conductive material having two terminals as in the case of the contact sheet of FIG. 5. The two or more cantilevers 9 are respectively bonded to adjacent edges of a through hole 2 at one end thereof such that they are oriented in parallel to each other, and each cantilever 9 has a lower supporting portion 10 and a spherical terminal holding portion 11. The lower supporting portions 10 are composed of planar portions formed adjacently to portions fixed to the sheet 1, and the spherical terminal holding portions 11 are formed by bending the other ends of the two or more cantilevers 9 toward one of two openings of the through hole 2.

Figure 10:
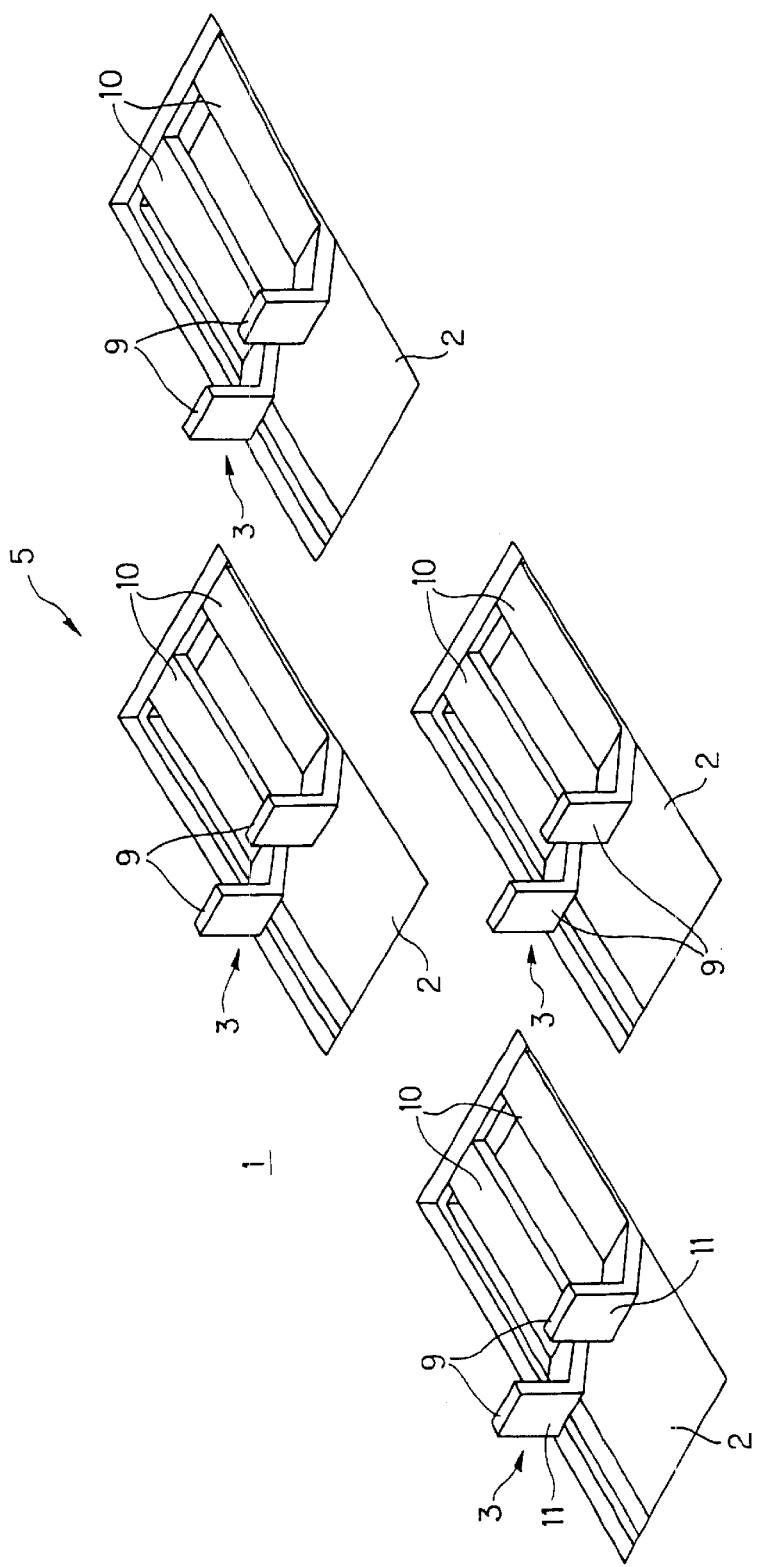
FIG. 10 is a perspective view showing an example of a contact sheet for application to a socket of a ZIF structure.
Figure 11A:
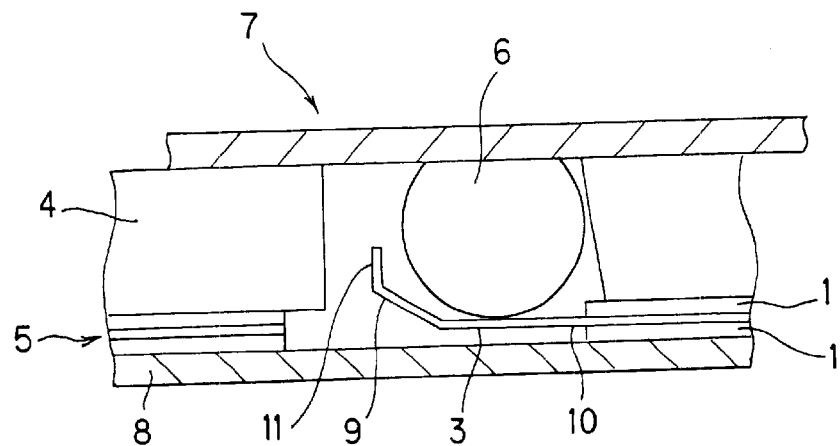
Figure 11B:
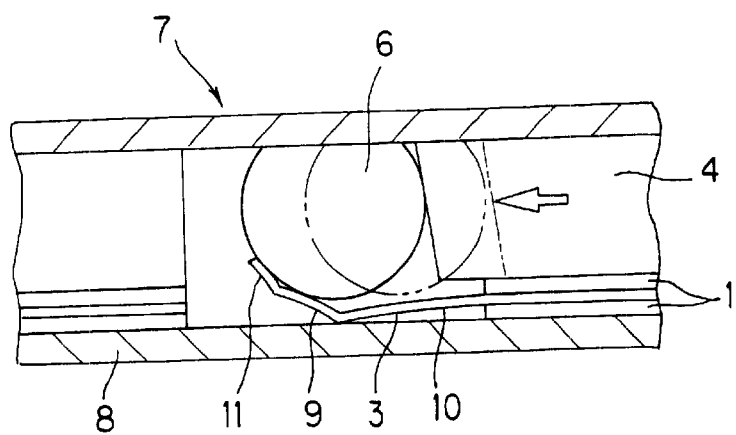
Figure 12:
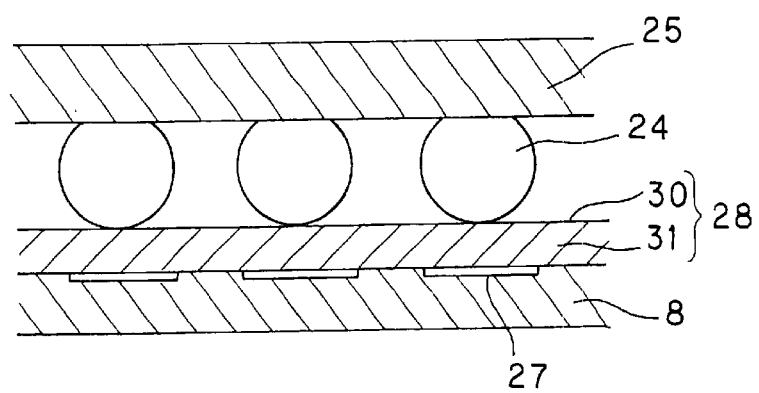
FIG. 12 is a schematic sectional view showing an example of a conventional contact sheet.

FIG. 11(a) and FIG. 11(b) illustrate examples wherein sockets of the ZIF structure have been configured using the contacts sheets shown in FIG. 10 described above.

As shown in FIG. 11(a) and FIG. 11(b), in the ZIF structure, after the integrated circuit 7 has been mounted, it does not vertically shift; only a spacer 4 slides in the direction of an arrow (a lateral direction) of FIG. 11 (b) to mount the integrated circuit 7. In this case, a side surface portion of the spacer 4 that comes in contact with the spherical terminal 6 is formed to have a slope surface so that it comes in contact with and pushes an upper portion of the spherical terminal 6. Hence, the spherical terminal 6 pushes and spreads the spherical terminal holding portions 11 of the two or more cantilevers 9 in a direction away from the portions of the respective cantilevers 9 that are fixed to the sheet 1, and also flexes the lower supporting portions 10 toward a surface away from the sheet 1.

In the socket having such a ZIF structure, using a sheet of 10 to 40 μm as the contact sheet reduces a pressure of contact with the spherical terminal 6, so that a contact resistance of the whole can be reduced by increasing the number of contacts.

In the contact sheets in accordance with the present invention, the openings of the through holes may have a rectangular, triangular, round, or elliptic shape, etc.; however, the shape is preferably rectangular. In addition, when the openings are round, the diameter preferably ranges from 0.3 to 1.5 mm. If the diameter is below 0.3 mm, then manufacture will be difficult; if the diameter exceeds 1.5 mm, then no small pitch can be accomplished, meaning that means other than the present invention can be used.

Further preferably, the pitch of the through holes ranges from 0.25 to 1.5 mm. If the pitch is below 0.25 mm, then sufficient assembly accuracy cannot be secured; if the pitch exceeds 1.5 mm, then no advantages of an integrated circuit will be provided.

A conductive material employed for the contact sheets in accordance with the present invention is required to have strength, wear resistance, flexibility, oxidization resistance, etc. in addition to conductivity. It is especially desirable to use a spring material such as beryllium copper or nickel beryllium. Using these materials as the conductive material makes it possible to impart fatigue property and heat resistance to high temperatures to the contact sheets in accordance with the present invention.

Preferably, the thickness or size of the cantilever as the contact spring ranges from 0.01 to 0.1 mm, and more preferably, it ranges from 0.02 to 0.05 mm. This is because of the following reason: if the thickness or size is below 0.01 mm, then the strength of the cantilever will be too small, making it difficult to obtain an appropriate contact load; if it exceeds 0.1 mm, then the elasticity range of the materials will be exceeded, so that terminals of an integrated circuit will not be able to take a sufficient displacement to press the cantilever against an element to be connected that exists on an opposite side of a sheet, making it difficult to secure a stable continuity.

An elastic material constituting the contact sheets is required to exhibit resistance to heat, weather, etc., and a rubber such as a silicone rubber or a synthetic rubber, or a resin such as a polymer, a polyimide, or an engineering resin is used. A polyimide constituent in particular is suitably used.

Moreover, the contact sheets in accordance with the present invention can be ideally used as contact boards when mounting integrated circuits having spherical terminals on boards. To be more specific, the contact sheets can be ideally used when mounting integrated circuits provided with spherical terminals on a mounting board, testing board, etc. In particular, the contact sheets in accordance with the present invention can be suitably used for integrated circuits having grid arrays having terminal pitches ranging from 0.5 to 1.5 mm, the number of terminals thereof ranging from 500 to 2000. Reliable electrical conduction can be secured in integrated circuits having multi-pin grid arrays that have conventionally been prone to incur unstable electrical conduction if warps occur.

Figure 16A:
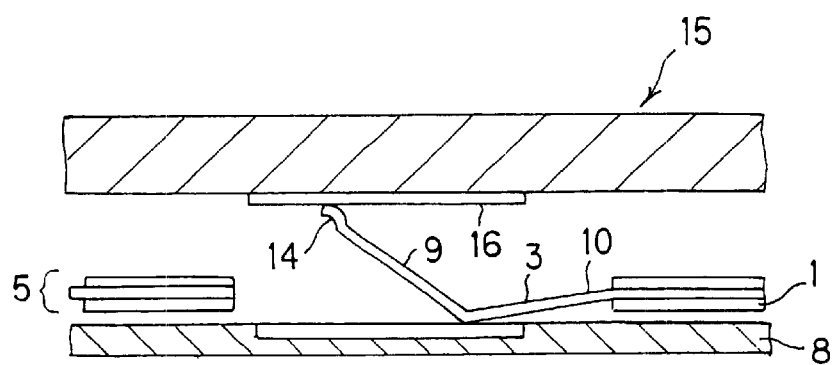
Figure 16B:
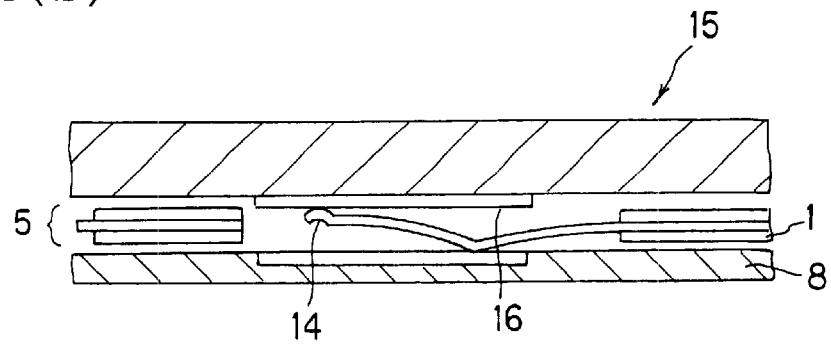
FIG. 16(b) shows a state after mounting.

The terminals of integrated circuits may be spherical or planar (LGA: land grid array). FIG. 16(a) and FIG. 16(b) show examples wherein an LGA integrated circuit 15 is mounted on a board 8. A planar terminal 16 pushes from above terminal holding portions 14 with a rounded tip of two or more cantilevers 9, causing the spherical terminal holding portions 14 of the cantilevers 9 to be pushed and spread in a direction away from portions of the respective cantilevers 9 that are fixed to a sheet 1 and, at the same time, pressed against the board, thus securing contact.

Also in an integrated circuit having LGA, the lower supporting portion 10 is bent on the side of the board 8 as shown in FIG. 16(a) and FIG. 16(b). Even if the integrated circuit 7 is not mounted, contact resistance is lowered to increase reliability by a contact sheet whose lower supporting portion 10 is previously in contact with the substrate 8.

Also in a planar terminal, two-ply contact sheet can make displacement twice as large as a contact sheet having contact springs having the same elasticity.

Figure 17A:
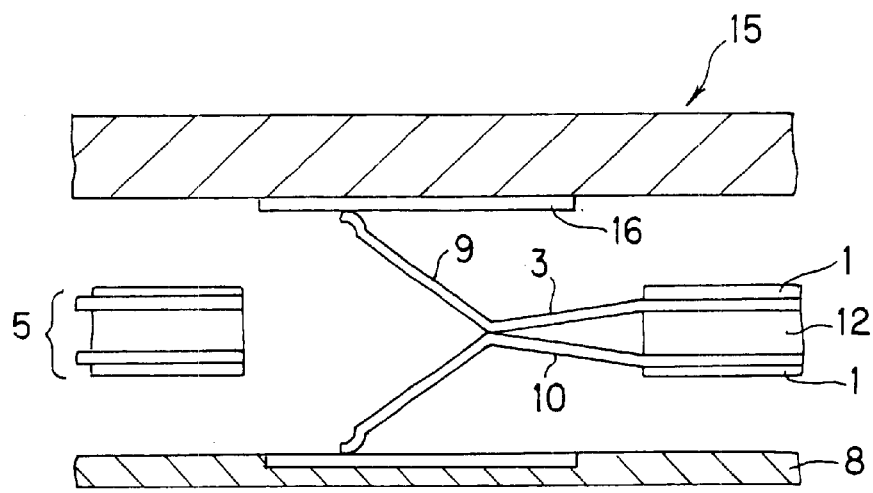
Figure 17B:
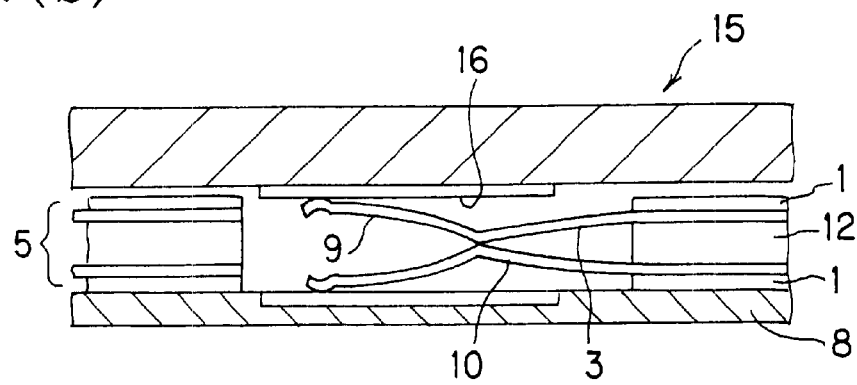
FIG. 17(b) shows a state after mounting.

In a two-ply contact sheet, it is preferable that cantilevers of two contact spring on both sides of the adhesive sheet are brought into contact with each other with applying pressure to each other before the integrated circuit is mounted because reliability is increased. FIG. 17 shows an embodiment of a cantilever in a two-ply contact sheet of the present invention in the case that it is used in an integrated circuit having LGA.

FIGS. 15(a)–(e) show various embodiments in which an integrated circuit is mounted on a contact sheet of the present invention.

Figure 15A:
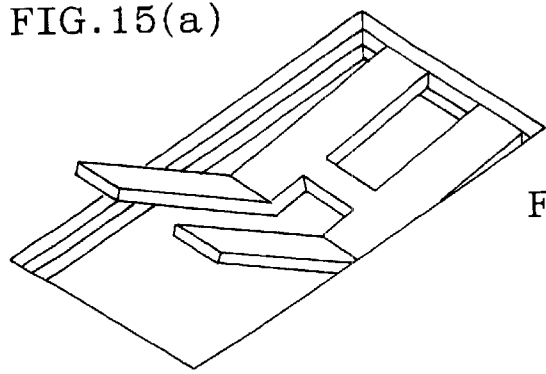
FIGS. 15(a)–(e) are explanatory views showing various modes wherein an integrated circuit is mounted on a contact sheet in accordance with the present invention.
Figure 15D:
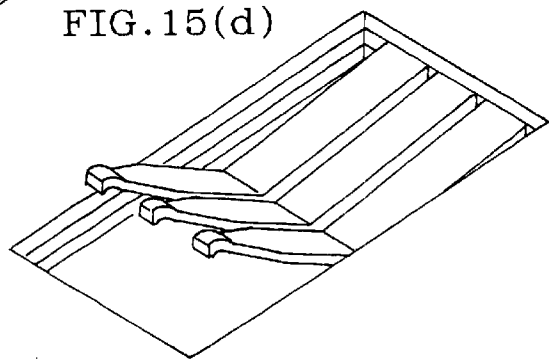
Figure 15B:
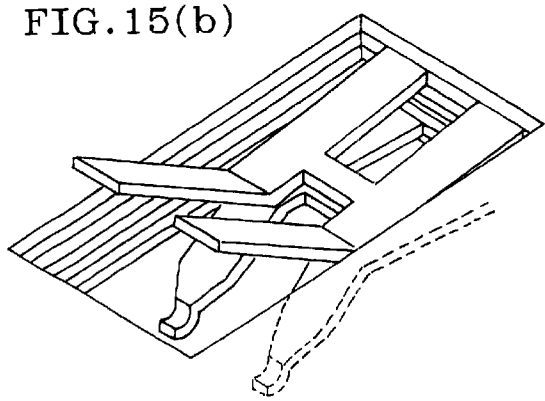

FIGS. 15(a)–(b) are embodiments where an integrated circuit having a spherical terminal is mounted and where a contact spring is constituted by two cantilevers. FIG. 15(a) shows a case of a contact sheet, and FIG. 15(b) shows a case of two contact sheets. In the case of two contact sheets of FIG. 15(b), displacement can be twice as large as a case of one contact sheet of FIG. 15(a).

Figure 15E:
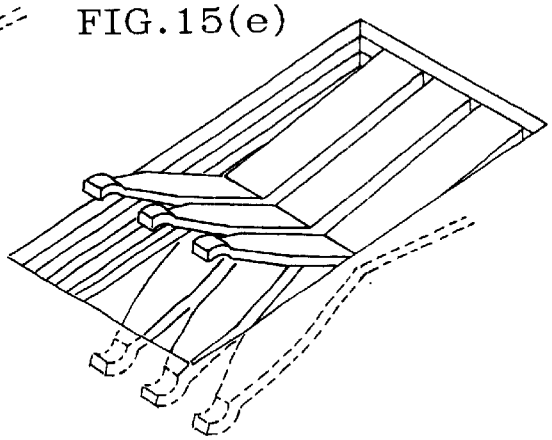
Figure 15C:
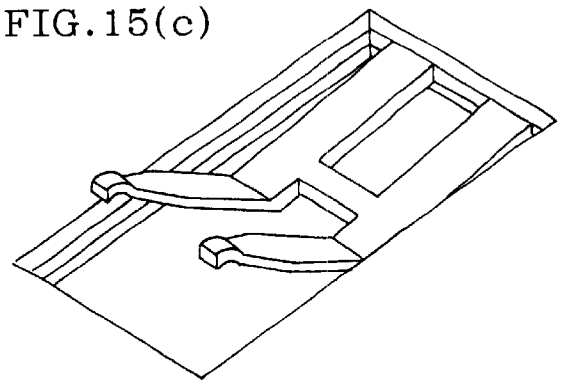

FIGS. 15(c)–(e) show an embodiment where an integrated circuit having a planar terminal is mounted. FIG. 15(c) shows the case of one contact sheet where a contact spring is constituted by two cantilevers, FIG. 15(d) shows the case of one contact sheet where a contact spring is constituted by three cantilevers, and FIG. 15(e) shows the case of two contact sheets where a contact spring is constituted by three cantilevers. If the same cantilevers are used, contact load is in proportion to the number of cantilevers. That is, it is possible for the contact sheet having three cantilevers of FIGS. 15(d) and 15(e) to be subjected to contact load by 1.5 times larger than a contact sheet having two cantilevers of FIG. 15(a) and 15(b).

The contact sheet in accordance with the present invention is manufactured according to for example, a method described below.

First, a sheet formed of a conductive material is bonded to a sheet having numerous through holes and composed of an insulative elastic material, then etching or the like is performed thereon such that only portions where contact springs will be formed are left unetched, and the portions where the contact springs will be formed are cut and bent by press work or the like. As necessary, before or after the pressing work, the contact springs may be provided with plating. Lastly, another sheet composed of an elastic material is bonded on a side where the contact springs are exposed to complete the contact sheet in accordance with the present invention. It is a matter of course that this process may be conducted before press machining.

Alternatively, first, sheets where in the contact springs are joined are produced by subjecting a sheet formed of a conductive material to etching, pressing, etc., then the sheets are sandwiched and bonded between two sheets having through holes and formed of insulative elastic material, and the contact springs are cut by pressing or the like, and the laminate is subjected to bending. The cutting and bending work by pressing or the like may be performed with the portions, where the contact springs will be formed, bonded to one of the sheets formed of an elastic material. Furthermore, the contact springs may be provided with plating before or after the pressing work.

A two-ply contact sheet which can have twice as much displacement is produced by preparing two contact sheet produced by any one of the aforementioned methods, preparing an adhesive sheet having the same pattern of through holes, putting the adhesive sheet between the two contact sheet so that the pattern of through holes of the adhesive sheet matches those of the two contact sheets, and subjecting them to thermocompression bonding.

Embodiments

The present invention will be described in more detail in conjunction with embodiments; however, the present invention is not limited to the embodiments.

First Embodiment

A total of 529 through holes, 23 columns×23 rows, at 1.0-mm pitches were provided in a polyimide sheet (brand name: YUPIREX, produced by Ube Kosan Co., Ltd.) which is 50 $\mu$m thick and provided with a 10 $\mu$m-thick adhesive layer, on one surface thereof. Each of the through holes is rectangular, measuring 0.5 mm long and 1.0 mm wide. The through holes 2 were arranged such that the respective sides of the through holes 2 and the respective columns formed by the through holes 2 are oriented at an angle of 45 degrees with respect to the respective sides of the polyimide sheet 1.

Next, a beryllium copper plate which is 30 $\mu$m thick was attached by thermocompression bonding onto a surface of a polyimide sheet that is provided with an adhesive layer, and etching was carried out, leaving contact springs.

Subsequently, another polyimide sheet provided with through holes and the polyimide sheet with the foregoing beryllium copper sections left unetched were bonded to each other by thermocompression bonding. At this time, the sheets were bonded such that the surface having the adhesive layer faced the beryllium copper sections.

Subsequently, the sections remaining, in the rectangular through holes were cut by pressing and bent in the middle thereof to be formed into cantilevers having a predetermined shape. As necessary, heat treatment such as age hardening treatment may be performed at this stage. Thereafter, nickel/gold plating was conducted to produce the contact sheet in accordance with the present invention shown in FIG. 1.

When an integrated circuit having spherical terminals was mounted on a mounting board via the foregoing contact sheet, an oxide film was effectively removed and stable electrical conduction was obtained. Moreover, no crushed distal end portions of the spherical terminals were observed.

Second Embodiment

A total of 529 through holes, 23 columns×23 rows, at 1.0-mm pitches were provided in each of two polyimide sheets (brand name: YUPIREX, produced by Ube Kosan Co., Ltd.) which are 50 $\mu$m thick and provided with a 10 $\mu$m-thick adhesive layer on one surface each. Each of the through holes was rectangular, measuring 0.5 mm long and 1.0 mm wide. The through holes 2 were arranged such that the respective sides of the through holes 2 and the respective columns formed by the through holes 2 are oriented at an angle of 45 degrees with respect to the respective sides of the polyimide sheet 1.

In addition, a beryllium copper plate having a thickness of 30 $\mu$m was etched, leaving consecutive beams having a width of 0.12 mm unetched in which contact springs were to be formed.

Then, the etched beryllium copper plate was sandwiched between the two polyimide sheets mentioned above, and bonded by thermocompression bonding. The thickness of the bonded sheet was approximately 0.15 mm.

Subsequently, one lend of each of two beams left in a rectangular through hole was cut by pressing and bent in the middle thereof to form it into a cantilever of a predetermined shape. Thereafter, nickel/gold plating was conducted to make the contact sheet in accordance with the present invention shown in FIG. 5.

When an integrated circuit having spherical terminals was mounted on a mounting board via the foregoing contact sheet, an oxide film was effectively removed and stable electrical conduction was obtained. Moreover, no crushed distal end portions of the spherical terminals were observed.

Third Embodiment

Two contact sheets were produced in the same manner as in Example 1.

Then, an adhesive film was provided with through holes having the same shape and the same size with the same pattern as the contact sheets. That is, a total of 529 through holes having a rectangular shape of 0.5 mm in length and 1.0 mm in width, 23 columns×23 rows, at 1.0-mm pitches. The adhesive film was put between the two contact sheets so that the contact springs might be symmetrical with the adhesive film being centered and subjected to thermocompression bonding to obtain a two-ply contact sheet.

A single contact sheet had a displacement of about 0.3 mm, while ply contact sheet had a displacement of about 0.6 mm, which was twice larger.

When an integrated circuit having spherical terminals was on a mounting board via the above two-ply contact sheet, stable conductivity was obtained. When contact sheets in accordance with the present invention are used as contact boards for integrated circuits having spherical terminals, oxide films are removed and reliable electrical conduction can be secured without crushing distal end portions of spherical terminals. In addition, since current passing distances in contact springs are shorter, the contact sheets can be ideally used for high-frequency test boards or mounting boards. In particular, the contact sheets in accordance with the present invention are able to secure reliable electrical conduction in integrated circuits having small-pitch grid arrays that have been prone to suffer from unstable electrical conduction if a warp arises.

What is claimed is:

1. A contact sheet used for connecting an electronic device having terminals to a board;

said contact sheet being unitarily formed from two sheets of insulating elastic material bonded together via an adhesive sheet, each of the two sheets of said contact sheet having a plurality of through-holes and an equal or less number of contact springs on both sides of said adhesive sheet, and said adhesive sheet having through-holes with the same pattern as that of the two insulating sheets of said contact sheet;.

said contact sheet further comprising:

protruding contact springs in some or all of said through-holes provided in said contact sheet;

each of said contact springs comprising a conductive material and being constituted by one or more cantilevers fixed onto said contact sheet by bonding or sandwiching at one end thereof;

said each cantilever having a lower supporting portion and a terminal portion;

said lower supporting portion comprising a planar portion formed adjacently to a portion fixed to said contact sheet;

said terminal portion being formed by vertically or aslant bending the other end of said cantilever toward one of two openings of a through hole; and when said device is mounted, said terminal portion of each of said cantilevers is pushed and bent in a direction away from the portion of each cantilever that is fixed to the contact sheet, and at the same time, a boundary portion between the terminal portion and the lower supporting portion of at least one cantilever is pressed against said lower supporting portion or a boundary portion between the terminal portion and said lower supporting portion of a cantilever located on the other side of said adhesive sheet.

2. A contact sheet according to claim 1, wherein each contact spring is composed of three cantilevers, said three cantilevers are disposed virtually parallel to each other in said through hole, and two cantilevers on both ends of said three cantilevers and one cantilever in the middle are fixed to edges of said through hole that oppose each other.

3. A contact sheet according to claim 1, wherein dispositions of said contact springs installed in a through-hole of an arbitrary one column and dispositions of said contact springs installed in a through-hole of another column adjacent to said one column have a point symmetrical relationship; and said terminals of each column of said electronic device push and bend cantilevers constituting said contact springs facing said electronic device in a direction away from the portion of each cantilever that is fixed to said sheet to be well-balanced and press cantilevers constituting said contact springs facing a board against said board at a time of mounting an electronic device.

4. A contact sheet according to claim 2, wherein each cantilever is disposed such that it is parallel to a direction of a column to which a through hole wherein said cantilever is installed belongs.

5. A contact sheet according to claim 3, wherein each cantilever is disposed such that it is parallel to a direction of a column to which a through hole wherein said cantilever is installed belongs.

6. A contact sheet according to claim 3, wherein each contact spring is composed of two or more cantilevers, two cantilevers are disposed parallel to each other in said through hole, and two cantilevers are fixed to edges of the through hole that oppose each other thereby to minimize a pressing force applied when an integrated circuit is mounted thereon.

7. A contact sheet according to claim 1, wherein each contact spring is composed of two or more cantilevers, the two or more cantilevers are disposed parallel to one another in said through hole, and a bridge connecting the lower supporting portion of the two or more cantilevers fixed to edges of the through holes adjacent to each other among the two or more cantilevers is provided.

8. A contact sheet according to claim 3, wherein each contact spring is composed of two or more cantilevers, the two or more cantilevers are disposed parallel to one another in said through hole, and a bridge connecting the lower supporting portion of the two or more cantilevers fixed to edges of the through holes adjacent to each other among the two or more cantilevers is provided.

9. A contact sheet according to claim 1, said cantilevers are in contact with the board before the integrated circuit is mounted.

10. A contact sheet according to claim 3, wherein said cantilevers are in contact with the board before the integrated circuit is mounted.

11. A contact sheet according to claim 1, wherein said contact sheet is an anisotropic conductive film.

12. A contact sheet according to claim 3, wherein said contact sheet is an anisotropic conductive film.

13. A contact sheet according to claim 1, wherein said cantilevers constituting said contact springs arranged on both sides of said adhesive sheet contact each other by applying pressure to each other before being mounted to an electronic device.

14. A contact sheet according to claim 3, wherein said cantilevers constituting said contact springs arranged on both sides of said adhesive sheet contact each other by applying pressure to each other before being mounted to an electronic device.

15. A contact sheet according to claim 1, wherein two sheets composed of an insulative elastic material are superposed and one end of said cantilever is bonded to said two sheets so as to fix said cantilever to said sheet, resultantly without space for detaching a connecting bar.

16. A contact sheet according to claim 3, wherein two sheets composed of an insulative elastic material are superposed and one end of said cantilever is bonded to said two sheets so as to fix said cantilever to said sheet, resultantly without space for detaching a connecting bar.

17. A contact sheet according to claim 1, wherein each of said plurality of contact springs is formed symmetrically in relationship with a center of said adhesive sheet.

18. A contact sheet according to claim 1, wherein each of said plurality of contact springs is formed asymmetrically in relationship with a center of said adhesive sheet.

19. A contact sheet according to claim 3, wherein each of said plurality of contact springs is formed symmetrically in relationship with a center of said adhesive sheet.

20. A contact sheet according to claim 3, wherein each of said plurality of contact springs is formed asymmetrically in relationship with a center of said adhesive sheet.

* * * * *